United States Patent [19]

Edwards

[11] Patent Number: 4,763,083
[45] Date of Patent: Aug. 9, 1988

[54] LOW PHASE NOISE RF SYNTHESIZER

[75] Inventor: Allen P. Edwards, Palo Alto, Calif.

[73] Assignee: Hewlett-Packard Company, Palo Alto, Calif.

[21] Appl. No.: 859,096

[22] Filed: May 2, 1986

[51] Int. Cl.$^4$ .......................... H03L 7/18; H03L 7/22
[52] U.S. Cl. .......................................... 331/2; 331/16; 331/25; 455/260
[58] Field of Search ...................... 331/2, 25; 450/255, 450/260; 455/77, 120, 125, 257, 258, 259

[56] References Cited

U.S. PATENT DOCUMENTS 4,107,612 8/1978 Leveque ........................ 331/25 X

*Primary Examiner*—Eugene R. LaRoche
*Assistant Examiner*—David Mis
*Attorney, Agent, or Firm*—James M. Williams

[57] ABSTRACT

A low phase noise RF synthesizer comprises three phase-locked loops. In the preferred embodiment, the base RF signal, 980 to 1520 MHz in 20 MHz steps is generated by one loop, while the high resolution IF signal is generated by a fractional-N loop. The RF and IF signals are combined in a third phase-locked loop, the output sum loop, to produce the output signal. A programmable variable divider divides the IF output frequency, achieving coverage over the necessary frequency range by changing the divide number, so the fractional-N circuit only has to fill in the fine steps between the divide numbers. A reference input frequency in the fractional-N loop has each of the factors 2, 3, and 5 in its divisor, so that the output signal of the synthesizer can be multiplied by any of these factors without producing a fractional frequency.

It will be appreciated that the advantages achieved by the aspects of the invention incorporated in certain portions of the synthesizer described have independent utility and could be used in a variety of synthesizer designs. This is particularly true for the variable divider, e.g., divider 191, in the IF reference loop output and for the multi-factor divider, e.g., divider 187, in the IF reference loop input.

4 Claims, 2 Drawing Sheets

LOW PHASE NOISE RF SYNTHESIZER

BACKGROUND AND SUMMARY OF THE INVENTION

The invention relates generally to a low noise RF frequency synthesizer, and in particular to a quiet, inexpensive IF reference loop for an RF synthesizer which gives very low phase noise levels at a relatively low cost.

A well-known tradeoff in synthesizer design is between frequency resolution on one hand and phase noise or spectral purity on the other. The problem arises because the noise content of a signal increases somewhat linearly as the bandwidth of the signal increases. Thus, for a synthesizer with a given frequency range, increasing the frequency resolution results in an output signal with higher phase noise.

To achieve a reasonable frequency range with good resolution and low phase noise, synthesizers have used a series of phase-looked loops generating successively narrower frequency ranges and equivalent bandwidths. In order to achieve 1.0 Hz resolution over 1000 to 1500 MHz, five or six separate loops have typically been required. The frequencies are generated by multiplying a reference frequency through a series of multipliers and using summing loops for each frequency range. One technique uses a fractional-N summing loop for the final high resolution loop. The main disadvantage of these synthesizers has been that many loops are required to provide both the desired low noise signal, high resolution and wide frequency coverage at the same time. This increases the cost and complexity of the synthesizer.

An object of the invention is to provide a relatively low cost synthesizer that produces a low noise, high resolution signal over a wide frequency range.

Another object of the invention is to provide a synthesizer that produces the desired output signal using fewer phase-locked loop circuits than currently known devices.

A further object of the invention is to provide a synthesizer whose output signal contains the prime factors up to five in its divisor, so that the synthesizer's output signal can be multiplied by any of those factors without producing a fractional frequency result.

In accordance with the preferred embodiment of the invention, a relatively low cost synthesizer achieves 1.0 Hz resolution over a 1000 to 1500 MHz frequency range with a low phase noise output signal using only three phase-locked loops. The base RF signal, 980 to 1520 MHz in 20 MHz steps is generated by one loop, while the high resolution IF signal is generated by a fractional-N loop. The RF and IF signals are combined in a third phase-locked loop, the output sum loop, to produce the output signal. A programmable variable divider divides the IF output frequency, achieving coverage over the necessary frequency range by changing the divide number. The fractional-N circuit thus only has to fill in the fine steps between the divide numbers, with the largest bandwidth requirement being the range between the two lowest divide numbers. This reduces the effect of the noise from the IF reference loop because the coverage obtained by increasing the divide number reduces noise in contrast to the other techniques for increasing frequency coverage which increase noise.

Another aspect of the invention is the use of a reference frequency in the fractional-N loop that has each of the factors 2, 3, and 5 in its divisor. This is accomplished by substituting a divide-by-96 circuit where a divide-by-100 would normally be used. The result is that the output signal of the synthesizer can be multiplied by any of these factors without producing a fractional frequency.

DETAILED DESCRIPTION OF THE PREFERRED EMBODIMENT

Figure 1:
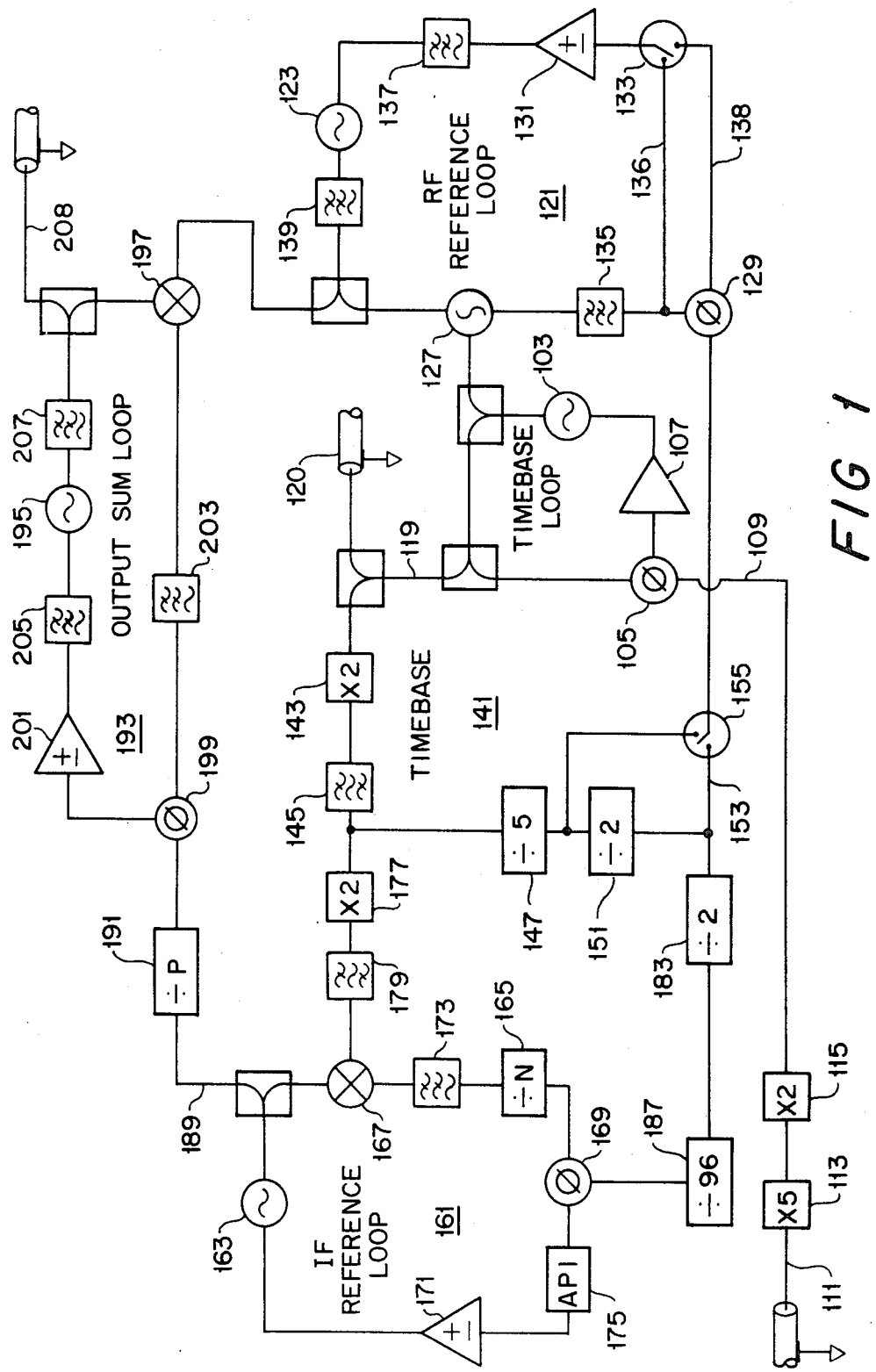
FIG. 1 is a schematic block diagram of a synthesizer constructed in accordance with the preferred embodiment of the invention.

A schematic block diagram for the preferred embodiment of the invention is shown in FIG. 1. The synthesizer includes three phase-locked loops and a reference frequency section.

The RF frequencies are directly or indirectly generated from a 100 MHz crystal oscillator in the timebase section 141. RF reference loop 121 generates an RF signal that can step from 980 MHz to 1520 MHz in 20 MHz steps using the reference frequencies from timebase section 141. IF reference loop 161 provides the high resolution fine frequency steps, generating a 10 MHz to 20 MHz signal with 1.0 Hz steps. The RF and IF signals are combined in the output sum loop 193, yielding the output signal of 980 MHz to 1520 MHz with 1.0 Hz resolution.

Timebase 141 provides reference and mixing frequencies for RF reference loop 121 and IF reference loop 161, starting with a 100 MHz signal from crystal oscillator 103. Timebase 141 provides the following frequencies: 100 MHz for downconverting the ocsillator output frequency in the RF loop 121; switched 20 MHz and 40 MHz reference frequencies for the RF loop 121; 400 MHz for downconverting the oscillator output frequency in the IF loop 161; a 10 MHz reference frequency for the IF loop 161; and a 100 MHz auxiliary output.

The 100 MHz reference signal generated by time base loop 101 can be locked to an external 10 MHz input signal on input line 111 by operation of timebase loop 101, which comprises oscillator 103, phase detector 105, and amplifier 107 connected in a phase-locked loop. The external reference signal on line 111 is multiplied up to 100 MHz by multipliers 113 and 115 and applied to phase detector 105 via input 109. The 100 MHz output signal from timebase loop 101 is applied to the RF reference loop 121 via line 117, to the timebase 141 via line 119, and to auxiliary output jack 120.

In timebase 141, the 100 MHz signal on line 119 is doubled by multiplier 143 to produce a 200 MHz signal, then filtered by bandpass filter 145 to suppress spurious frequencies and doubled again by multiplier 177 to produce a 400 MHz signal. The 400 MHz signal is filtered by a 400 MHz surface acoustic wave bandpass filter 179 and applied to the IF reference loop 161 via line 181. The 200 MHz signal from filter 145 passes through divider 147 which divides by 5 to produce a 40 MHz signal. The 40 MHz signal is applied to output line 149 and also applied to divider 151 which divides by two to produce a 20 MHz signal. The 20 MHz signal in turn is applied to output line 153 and to divider 183 which divides the signal by two to produce a 10 MHz signal which is applied to the IF reference loop 161 on line 185. Switch 155 selects either the 40 MHz signal on line 149 or the 20 MHz signal on line 53 to be applied to the RF reference loop 121 on line 157.

RF reference loop 121 generates a 980 to 1520 MHz signal in 20 MHz steps. RF reference loop 121 includes oscillator 123, sampler 127, phase detector 129 and amplifier 131 connected in a phase-locked loop. The output signal from oscillator 123 is filtered by a 1.7 GHz low pass filter 139 to suppress unwanted harmonics. Signal sampler 127 receives the filtered output signal from oscillator 123 and the 100 MHz reference signal from time base loop 101 to produce 0 Hz, 20 MHz or 40 MHz sum or difference signal, depending on the frecqency generatad by oscillator 123. The sum or difference signal is filtered by a 50 MHz low-pass filter 135 to remove unwanted higher frequencies. The 20 MHz or 40 MHz signal is applied to phase detector 129, which also receives either the 20 MHz or 40 MHz reference signal from time base 141 as selected by switch 155 on line 157. Switch 133 selects the 0 Hz DC lock signal on line 136, for frequencies that are multiples of 100 MHz, or the IF lock signal from phase detector 129, to be applied to amplifier 31. The signal from amplifier 131 is filtered by 7 MHz low pass filter 137 and applied to oscillator 123. The gain of amplifier 131 may be switched to either positive or negative polarity to lock the loop to either the upper or lower sideband from phase detector 129.

When switch 133 selects line 136, the output from oscillator 123 will be n times the 100 MHz output from oscillator 103. The selection of n is done by setting oscillator 123 close to the desired frequency before phase lock is established. This allows the output of oscillator 123 to be locked at frequencies every 100 MHz, e.g., 1000, 1100, 1200 . . . MHz.

When switch 133 selects line 138 and switch 155 selects line 149, the input to phase detector 129 is 40 MHz and the output of the sampler 127 will be 40 MHz by the operation of phase detector 129. The frequency of oscillator 123 will be either 40 MHz above or 40 MHz below n times 100 MHz as determined by the polarity of amplifier 131. This allows the output of oscillator 123 to be locked at frequencies n times 100 MHZ plus or minus 40 MHz, e.g., 1040, 1060, 1140, 1160 . . . MHz. When switch 155 selects line 153, the input to phase detector 129 is 20 MHz, which allows the output of oscillator 123 to be locked at frequencies n times 100 MHz plus or minus 20 MHz, e.g., 1020, 1080, 1120, 1180 . . . MHz.

Taken together, these output frequency combinations provide outputs at 20 Mhz steps, that is, any output at n times 100 plus 20, 40, 60, or 80 MHz is possible . Thus, RF reference loop 121 can produce a signal with 20 MHz resolution with respect to any selected output signal. The output signal from RF reference loop 121, the filtered output of oscillator 123, is applied to the output sum loop via line 159.

IF reference loop 161 is a fractional-N phase-locked loop which provides an output signal from 10 to 20 MHz in fractional Hz steps. This output signal is combined with the output of the RF reference loop 121, as described below, to produce the selected synthesizer output signal with a 1 Hz resolution. The frequency range of the IF reference loop is adequate to cover the 20 MHz step size interval of the RF reference loop output.

IF reference loop 161 includes oscillator 163, mixer 167, filter 173, fractional-N divider circuit 165, phase detector 169, phase correction circuit 175 and amplifier 171. The output from oscillator 163, a 421 to 422 MHz signal, is applied to mixer 167 with the 400 MHz reference signal from time base 141 to produce a 21 to 42 MHz difference signal. The 21 to 42 MHz difference signal is filtered by a 60 MHz low pass filter 173 and applied to fractional-N divider 165. Divider 165 uses the fractional-N technique to produce a division by 210.XXX to 420.XXX. The output of divider 165 is applied to phase detector 169 which also receives a 104.2 KHz reference signal from time base The 104.2 KHz reference is produced by dividing the 10 MHz signal on line 185 by 96 at divider 187. The output of phase detector 169 is smoothed by API 175 and applied to amplifier 171 to drive oscillator 163, completing the loop. The gain of amplifier 171 may be switched to positive or negative polarity to lock the loop to either the upper or lower sideband from mixer 167. The output of the fractional-N IF reference loop 161 is a signal of 421.001 to 442.000 MHz which is applied to variable divider circuit 191. Divider circuit 191 divides this signal by a variable interger ranging from 22 to 44 to produce a 10 to 20 MHz output signal with 1.0 Hz resolution to be applied to phase detector 199 of output sum loop 193.

In general, about an octave tuning range is required at phase detector 199. In previous synthesizers, this range has customarily been produced by an IF reference loop followed by a fixed divider, generally a divide-by-two. Because the divider is fixed, the variable oscillator in the IF reference loop must be able to cover the octave range. According to the present invention, the tuning range is produced by a fractional-N IF reference loop followed by a variable divider with a large divisor, e.g., 22 to 44. Because varying the divisor can provide coverage of a large portion of the tuning range, the variable oscillator in the IF reference loop needs to cover only a fraction of an octave. The result is to reduce the noise of the IF reference signal while providing continuous coverage in small steps over the required octave tuning range.

The noise contribution from the fractional-N loop consists of two parts. One source of noise is the fractional noise which is a function of the fractional division and the nonideality of the API. This noise is reduced by the factor used for the divisor in the output divider. Thus, using the 22 to 44 divider of the invention, rather than the divide-by-2 customarily used, reduces this source of noise by a factor between 11 and 22. The second source of noise is proportional to the varactor tuning range of oscillator 163. Since the fractional-N divider is working at approximately 20 to 40 MHz, the tuning range of oscillator 163 is 20 MHz. This range is twice the normally required 10 MHz, but here again the noise is reduced by the factor of the divisor, so this noise source is also reduced by a factor of between 11 and 22 over the conventional approach.

The variable divider has another advantage. For continuous coverage, the variable oscillator, i.e., oscillator 163, must cover the range of frequencies between the two smallest divide numbers. The larger the divisor, the smaller this range becomes with respect to the divided output. Thus, in general, the higher the frequency into the divider, the larger the divide number, the smaller the range that has to be covered and the lower the output noise becomes.

Output sum loop 193 combines the signal from RF reference loop 121 and the signal from IF reference loop 161 to produce the synthesizer's output signal. Output sum loop 193 includes oscillator 195, mixer 197, phase detector 199 and amplifier 201. The output signal from oscillator 195 is applied to mixer 197. Mixer 197 also receives the output signal from the RF sum loop 121 to produce a difference signal in the range of 10 to 20 MHz which is applied to phase detector 199. Phase detector 199 also receives the 10 to 20 MHz IF reference signal from divider 191. The output signal from phase detector 199 is applied to amplifier 201 to drive oscillator 195. The gain of amplifier 201 may be switched to either positive or negative polarity to lock the loop to the upper or lower sideband from mixer 197. Oscillator 195 therefore produces the desired output signal in the 980 to 1520 MHz range with 1.0 Hz resolution on output line 208.

Figure 2:
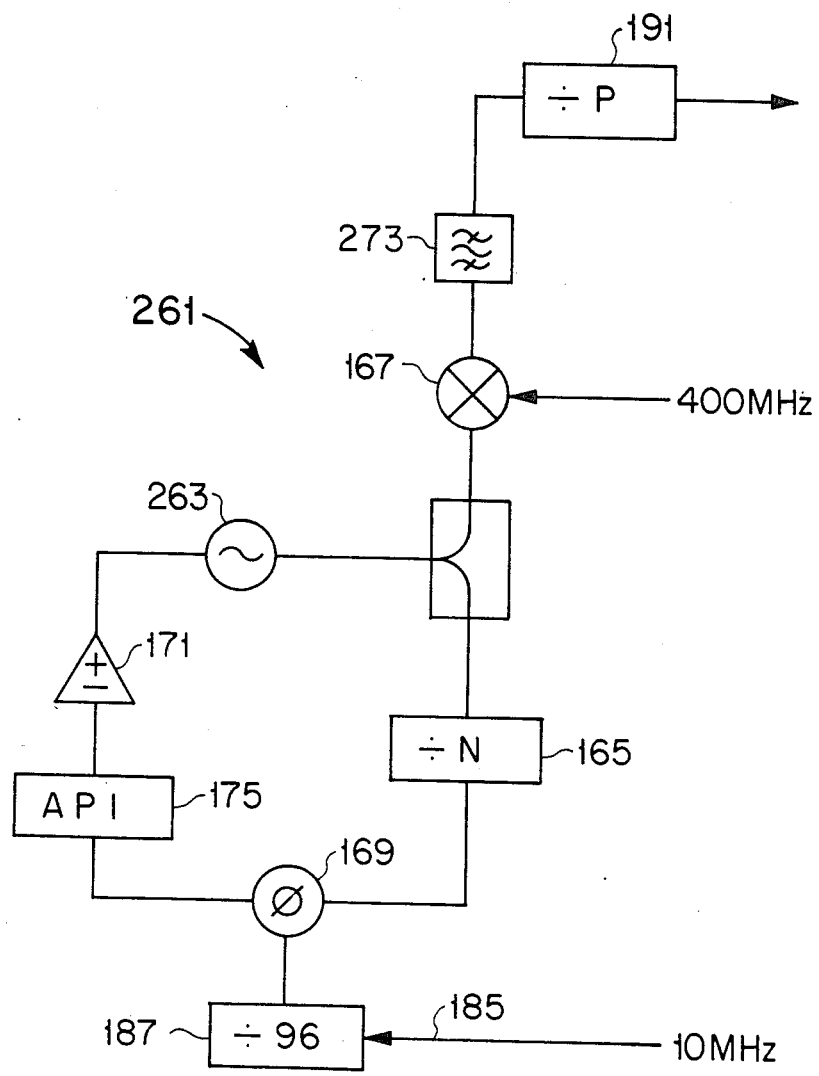
FIG. 2 is a schematic block diagram of an alternative embodiment of the IF reference loop section of the synthesizer of FIG. 1.

An alternative configuration for IF reference loop section is shown in FIG. 2. The elements in FIG. 2 which perform similar functions to the elements in FIG. 1 are identified by the reference numbers used in FIG. 1. IF reference loop 261 is a fractional-N phase-locked loop which provides an output signal from 10 to 20 MHz in fractional Hz steps, the same as the output of loop 161 shown in FIG. 1. The difference is that the variable oscillator 263 operates at lower frequency, and the output of oscillator 263 is mixed with the 400 MHz reference frequency and filtered outside the fractional-N loop rather than inside the loop.

IF reference loop 261 includes oscillator 263, fractional-N divider circuit 165, phase detector 169, phase correction circuit 175, amplifier 171, mixer 167 and filter 273. The output from oscillator 263, a 40 to 60 MHz signal, is applied fractional-N divider 165. Divider 165 uses the fractional-N technique to produce a division by 400.XXX to 600.XXX. The output of divider 165 is applied to phase detector 169 which also receives a 104.2 KHz reference signal from time base 141. The 104.2 KHz reference is produced by dividing the 10 MHz signal on line 185 by 96 at divider 187. The output of phase detector 169 is smoothed by API 175 and applied to amplifier 171 to drive oscillator 263, completing the fractional-N loop. The output of oscillator 263 is also applied to mixer 167 with the 400 MHz reference signal from time base 141 to produce a 440 to 460 MHz sum signal. The 440 to 460 MHz sum signal is filtered by a band pass filter 273 to eliminate unwanted harmonics. The output of IF reference loop 261 is a signal of 440.001 MHz to 460.000 MHz which is applied to variable divider circuit 191. Divider circuit 191 divides this signal by a variable interger ranging from 23 to 44 to produce a 10 to 20 MHz output signal with 1.0 Hz resolution to be applied to phase detector 199 of output sum loop 193.

I claim:

1. A frequency synthesizer for producing an output signal at any selected frequency within a set output range with predetermined resolution, comprising:
   timebase means for producing a plurality of reference frequency signals;
   means for producing an RF reference frequency signal synchronized with at least one of the timebase reference frequency signals and having a first step size;
   means for producing an IF reference frequency signal synchronized with at least one of the timebase reference frequency signals, having a frequency range adequate to provide coverage over the step size of the RF reference frequency signal, and having a step size smaller than said predetermined resolution, said IF reference signal generating means comprising,
      an IF reference loop for generating a first signal at a frequency that is a multiple of the desired IF reference frequency, and
      a variable divider for dividing the first signal by the factor required to produce the desired IF reference frequency signal; and
   means for combining the RF reference frequency signal and the IF reference frequency signal to produce the selected output signal having at least said predetermined resolution with respect to any selected frequency in the output range.

2. The frequency synthesizer of claim 1 wherein the IF reference signal has a frequency range of one half the step size of the RF reference signal, and wherein the means for combining the IF and RF signals is a phase-locked loop including an amplifier capable of being selectively switched to positive or negative gain, so that IF reference signal can effectively cover the entire step size of the RF reference signal.

3. The frequency synthesizer of claim 1 wherein the timebase reference frequency input signal for the IF reference loop contains a plurality of prime factors in its divisor, including 2, 3 and 5, so that the output signal of the synthesizer can be multiplied by any of the included prime factors to produce an integer frequency output.

4. The frequency synthesizer of claim 2 wherein the step size of the RF frequency signal is 20 MHz, the frequency range of the IF reference frequency signal is 10 MHz to 20 MHz, and the predetermined resolution is 1 Hz.

* * * * *